United States Patent
Jonas et al.

(10) Patent No.: US 12,068,209 B2
(45) Date of Patent: Aug. 20, 2024

(54) POWER MODULE

(71) Applicant: Siemens Aktiengesellschaft, Munich (DE)

(72) Inventors: Stephan Jonas, Neunburg (DE); Norbert Reichenbach, Amberg (DE); Juergen Trottmann, Falkenberg (DE)

(73) Assignee: Siemens Aktiengesellschaft, Munich (DE)

( * ) Notice: Subject to any disclaimer, the term of this patent is extended or adjusted under 35 U.S.C. 154(b) by 279 days.

(21) Appl. No.: 17/708,209

(22) Filed: Mar. 30, 2022

(65) Prior Publication Data
US 2022/0319939 A1    Oct. 6, 2022

(30) Foreign Application Priority Data

Mar. 30, 2021   (EP) ..................... 21165837

(51) Int. Cl.
*H01L 23/053* (2006.01)
*G01K 1/08* (2021.01)
*H01L 23/34* (2006.01)
*H01L 25/07* (2006.01)

(52) U.S. Cl.
CPC .............. *H01L 23/053* (2013.01); *G01K 1/08* (2013.01); *H01L 23/34* (2013.01); *H01L 25/072* (2013.01)

(58) Field of Classification Search
CPC .. H01L 23/053–057; H01L 23/34; G01K 1/08
See application file for complete search history.

(56) References Cited

U.S. PATENT DOCUMENTS

| | | | |
|---|---|---|---|
| 6,835,994 B2 | 12/2004 | Kistner et al. | |
| 7,190,070 B2* | 3/2007 | Manz | H01L 25/115 |
| | | | 257/E25.026 |
| 2003/0085423 A1* | 5/2003 | Kistner | H01L 23/34 |
| | | | 257/341 |
| 2012/0248564 A1* | 10/2012 | Hauenstein | H01L 23/564 |
| | | | 257/586 |

FOREIGN PATENT DOCUMENTS

| | | |
|---|---|---|
| DE | 10024516 A1 | 11/2001 |
| DE | 102007052630 A1 | 5/2009 |
| EP | 1568978 A1 | 8/2005 |
| EP | 2506300 A2 | 10/2012 |

OTHER PUBLICATIONS

NTC inside the EconoDUALTM 3 mounted on a separate DCB close to the IGBT in Kapitel 2 „Internal Design der Infineon Application Note AN2009-10 "Using the NTC inside a power electronic module", V1.0, Nov. 2009, Edition Jan. 13, 2010, Infineon Technologies AG, 59568 Warstein, Germany; Nov. 1, 2009 (Nov. 1, 2009), pp. 1-10, XP055841552; 2009.

* cited by examiner

*Primary Examiner* — Jared Fureman
*Assistant Examiner* — Christopher J Clark
(74) *Attorney, Agent, or Firm* — Laurence A. Greenberg; Werner H. Stemer; Ralph E. Locher

(57) ABSTRACT

A power module includes a housing having a carrier plate, housing walls and a housing cover. Semiconductor elements and a temperature sensor unit having a temperature sensor are disposed in the interior of the housing on the carrier plate. Partitions disposed in the interior of the housing separate the temperature sensor unit from the semiconductor elements and enclose the temperature sensor unit in a chamber.

10 Claims, 8 Drawing Sheets

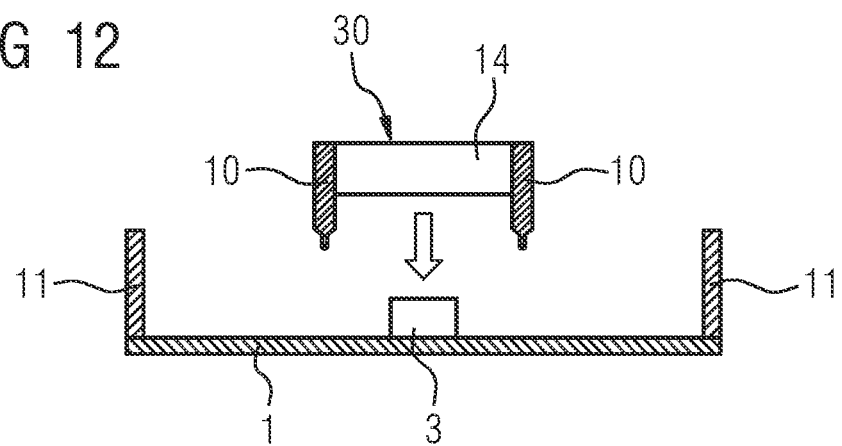
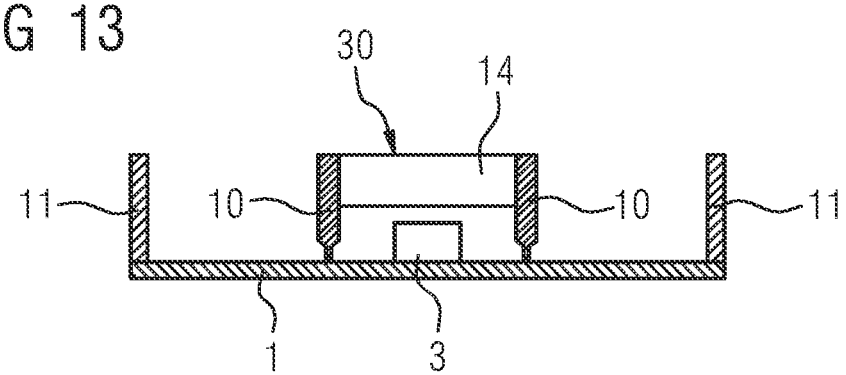
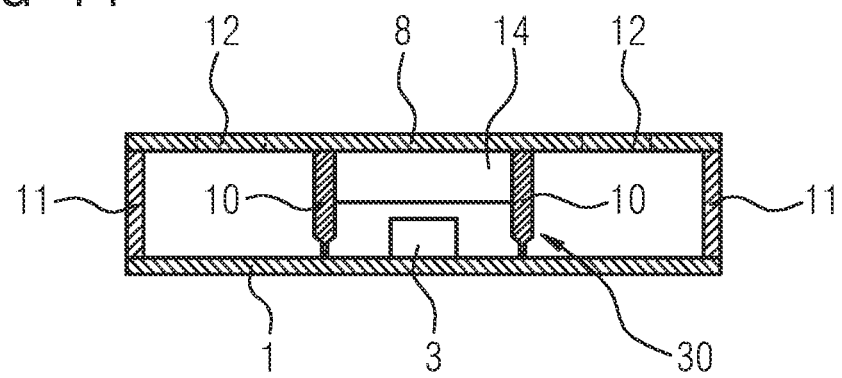

POWER MODULE

CROSS-REFERENCE TO RELATED APPLICATION

This application claims the priority, under 35 U.S.C. § 119, of European Patent Application EP 21165837.2, filed Mar. 30, 2021; the prior application is herewith incorporated by reference in its entirety.

FIELD AND BACKGROUND OF THE INVENTION

The invention relates to a power module.

Power electronic modules, also referred to as power modules, are used to control electrical energy flows. Amongst other things, power modules contain semiconductors which are used to suitably influence the current flow, and therefore the energy flow. The currents and voltages typically vary within the range of from 1 to 2000 amperes and from 40 to 1500 V.

The power modules are generally located in an electrical device having inputs and outputs through which the electrical energy enters and exits. In that device there is also usually a control unit that actuates the semiconductors of the power modules and performs further device-specific control and protective functions. Examples of electrical devices of that kind are electronic motor control devices that use thyristors as semiconductors, or converters for controlling electrical motors, in the case of which IGBTs (insulated-gate bipolar transistors) and thyristors are typically used as semiconductors. The entire unit including the electrical elements, semiconductors and connections through which the electrical energy flow passes is also referred to as the main circuit.

The semiconductors of the power modules become hot during control of the electric current as a result of the electrical losses arising in the semiconductors and can reach temperature values that restrict the function thereof or even destroy them if, for example, the current values become too high or the cooling system of the device is impaired. In order to protect the semiconductors, a temperature-sensitive component is therefore inserted in the power modules and can be used to approximately detect the temperature of the semiconductors. The temperature-sensitive component is also referred to below as the temperature sensor.

The temperature measured by the temperature sensor or an electrical variable corresponding to the temperature is generally transferred to the control unit which, upon predetermined temperature limit values being exceeded, transmits suitable control signals to the semiconductor elements for protection thereof.

Since, as a general rule, the control unit is constructed to be electrically insulated from the main circuit, the temperature sensor connected to the control unit is also disposed in the power module so as to be electrically insulated with respect to the semiconductors. That electrical insulation is achieved by a spatial distance between the temperature sensor and the semiconductors in combination with an electrically insulating potting compound.

While complying with the requirements of the electrical insulation, in that case the aim is to place the temperature sensor spatially as close as possible to the semiconductors for the following reasons. On one hand, the temperature measurement of the semiconductors is all the more accurate, as the spatial distance between the temperature sensor and the semiconductors becomes shorter. On the other hand, the general trend toward high power densities and therefore toward small structural volumes requires the semiconductor elements and the temperature sensor to be disposed as compactly as possible within the power module.

Due to malfunctions or external faults such as a short circuit on the output side of the device, for example, a very high current flow that is far above the permissible value of the semiconductors or the other current-carrying parts of the power module can occur in the semiconductors. That very high current value generally leads to the vaporization of electrically conductive parts within the power module.

The resulting plasma propagates in an explosive manner within the power module and causes severe damage within the power module. As a result of the propagation of the plasma, in the extreme case there can be a brief or else continuous faulty electrical connection between parts of the main circuit and the temperature sensor, and therefore to the control unit. The high voltage of the main circuit is then transferred to the control unit. Since the control unit is generally at the same voltage potential, which is normally harmlessly low, as the operating plane, the voltage transfer has to be avoided at all costs through appropriate measures.

In summary, it can therefore be said that the semiconductors of a power module should be protected from excessively high temperatures. For good protection, that is to say a temperature measurement that is as accurate as possible, a temperature sensor has to be disposed spatially as close as possible to the semiconductors, whereby the requirement for a compact construction is met at the same time. The requirement that the temperature sensor that is at the voltage level of the operating plane has to be electrically isolated from the high voltage level of the semiconductors and that the isolation also has to be guaranteed for the extreme situation of a short circuit is in opposition to the spatial compactness.

One solution for isolating the voltage levels resides in making the spatial distance between the semiconductors and the temperature sensor large enough that an electrical connection between the main circuit and the control unit cannot occur in the event of a short circuit. That, however, makes the power module larger and more expensive, and therefore reduces the possibility of producing compact devices with higher power density and lowers the accuracy of the temperature measurement. One example is shown in the left-hand image "NTC inside the EconoDUAL™ 3 mounted on a separate DCB close to the IGBT" in chapter 2 "Internal Design" of the Infineon Application Note AN2009-10 "Using the NTC inside a power electronic module", V1.0, November 2009, Edition 2010-01-13, Infineon Technologies AG, 59568 Warstein, Germany.

Another solution resides in providing fuse elements that protect the main circuit from damage in the event of a short circuit. Fuse elements entail increased costs and outlay. Furthermore they become very hot during operation, which, for example, in the course of switching cabinet construction leads to an additional outlay for cooling.

A further solution is to dispense with a temperature sensor integrated in the power module and instead execute it as a separate component with a dedicated housing, that is to say as an external temperature sensor, in such a way that a short circuit in the main circuit has no effect on the temperature sensor. As a result, a compact construction is only possible to a limited extent, the accuracy of the temperature measurement is not optimum and there are additional costs for the external temperature sensor through the dedicated housing, the separate fitting and the connection. An external temperature sensor of this\\at kind is described in European Patent Application EP1568978A1 (Siemens AG) 31 Aug. 2005.

The additional electrical isolation between the temperature sensor and the control unit represents a solution that is also used. In that case, it is assumed that, as a result of a short circuit, for example, the temperature sensor is at the same electrical potential as the main circuit. The required electrical isolation generally takes place within the control unit, for example using an optocoupler that transfers the temperature analog signal of the temperature sensor across an optical isolating distance to the voltage level of the control unit. In addition to the outlay on electrical components for connecting up the optocoupler, spatial distances in the region of the electrically isolating optocoupler also have to be maintained, which require a relatively large amount of space on the circuit board on which the electronic components are accommodated. In addition to the additional costs for the optocoupler and its electronic circuitry, that has an adverse effect on the compactness of the control unit and can cause the device to be enlarged. The right-hand image "NTC inside a module without baseplate, mounted close to the silicon" in chapter 2 "Internal Design" of the above-mentioned Infineon Application Note AN2009-10 shows a temperature sensor that is disposed close to the semiconductors. In that case, it can be necessary to electrically isolate the temperature sensor, as just described, from the control unit. Corresponding considerations for the isolation are cited in section 2.1 "Isolation considerations" of the above-mentioned Infineon Application Note AN2009-10.

SUMMARY OF THE INVENTION

It is accordingly an object of the invention to provide a power module, which overcomes the hereinafore-mentioned disadvantages of the heretofore-known devices of this general type, in which the temperature sensor is thermally closely coupled to the semiconductor or semiconductors and, in spite of this, is electrically isolated from the high voltage level of the semiconductors, even in the event of a fault.

With the foregoing and other objects in view there is provided, in accordance with the invention, a power module having a housing. The housing has a carrier plate, housing walls and a housing cover. In this case, the carrier plate acts as a base plate of the housing. The housing has an interior space that is enclosed by the carrier plate, the housing walls and the housing cover. The power module has semiconductor elements that are disposed in the interior of the housing on the carrier plate. The power module has a temperature sensor unit that is disposed in the interior of the housing on the carrier plate. This temperature sensor unit has a temperature sensor. The power module also has partitions that separate the temperature sensor unit from the semiconductor elements in the interior of the housing and enclose the temperature sensor unit in a chamber. These partitions form a chamber around the temperature sensor unit, which chamber largely closes off the temperature sensor unit, which is connected to the voltage level of the control unit, from the rest of that region of the power module that belongs to the voltage level of the main circuit.

Advantageous refinements of the power module according to the invention are the subject matter of the dependent claims.

The invention is based on the concept that, by way of a simple structural measure, namely with the aid of additional partitions in the interior of an existing housing of a power module, the temperature sensor of the temperature sensor unit remains thermally closely coupled to the semiconductor element or semiconductor elements and, in spite of this, the temperature sensor unit is electrically isolated from the high voltage level of the semiconductor elements, even in the event of a fault. The temperature sensor can therefore be disposed spatially close to the semiconductors, whereby the requirement for a compact construction is met at the same time. At the same time, the temperature sensor unit that is at the potential of the operating plane is electrically isolated from the high voltage level of the semiconductors by the partitions, wherein this isolation is also guaranteed for the extreme situation of a short circuit. The wall thickness of the partitions is chosen in such a way that a sufficient shielding effect or mechanical stability of the partition is guaranteed. In this case, the wall thickness is adapted to the performance or current intensity of a power module, and therefore to the short-circuit requirements and the destructive effects.

The invention can be implemented without great outlay: The outlay is substantially restricted to structural measures for the housing of the power module, which in the case of redevelopment generate no additional costs or only minimal additional costs. The compactness of the power module, and therefore of a device in which the power module is incorporated, is maintained since the proposed solution makes short distances between the semiconductors of the main circuit and the temperature sensor unit possible and therefore does not require any significant additional space. The accuracy of the temperature measurement is high due to the short distances between the semiconductors and the temperature sensor. Additional measures associated with time and costs are not necessary in device firmware to improve the accuracy.

According to a preferred embodiment of the invention, the partitions are connected to the housing cover and form a component with the housing cover. This has the advantage that the partitions are positioned in the interior of the housing when the housing cover is placed onto the housing walls.

According to a preferred embodiment of the invention, the partitions are in the form of a separate component that is disposed in the interior of the housing on the carrier plate. The chamber-like component is placed over the temperature sensor before the housing cover is fitted. Since the external dimensions of the power module are not altered by the partitions, but remain unchanged, the use of a separate component, which is in the form of a chamber, for already existing power modules is also possible and is a relatively simple retrofitting option, since no changes have to be made to the housing cover. The behavior of a power module, which has already been used, in the event of a short circuit can therefore be improved in a relatively simple manner.

According to a preferred embodiment of the invention, the wall thickness of the partitions reduces at the lower edge thereof that is facing the carrier plate This has the advantage that the partitions that extend as far as, or almost as far as, the carrier plate only reduce the thickness of the potting compound in the region of the reduced wall thickness to the extent that an electrically insulating potting compound, which encases the electrical components of the power module for protection from environmental influences and for electrical insulation, can still develop to a sufficient thickness.

A reduced wall thickness of the partitions at the lower edge thereof that is facing the carrier plate can also have the advantage that, as a result of the associated relatively small supporting surface of the partitions on the carrier plate, pressure on the partitions from above, for example as a result of a housing cover being placed thereon, leads to a relatively high surface pressure and therefore causes the lower edge of the partitions that is facing the carrier plate to nestle against the carrier plate without a gap. Air inclusions between the lower edge of the partition and the carrier plate that could lead to a deterioration of an insulating effect of the partition are therefore avoided.

According to a preferred embodiment of the invention, the partitions, with the lower edge thereof that is facing the carrier plate, reach as far as the carrier plate or merely form a narrow through-gap between the partitions and the carrier plate. This has the advantage that the chamber formed by the partitions is so stable that it is not destroyed by effects of a short circuit in the power module. In this case, the gap height of the through-gap is chosen in such a way that an electrically insulating potting compound filled into the interior of the housing can still flow through the through-gap but at the same time the shielding effect and mechanical stability of the partition are not substantially weakened.

The through-gap and the reduced wall thickness are related to one another and result from the potentially very limited space in the power module for accommodating the temperature sensor with simultaneous requirements in terms of electrical insulation and mechanical strength. If, in a case in which the distance between conductor surfaces to which the semiconductor elements are applied and a conductor track to which the temperature sensor unit is applied is only slightly larger than the partition thickness, the full thickness of the partition were to be pulled down as far as the carrier plate, this would be advantageous for the mechanical strength of the chamber, but there would only be a relatively narrow gap between the conductor surfaces and the partition, into which gap the potting has to flow in order to be able to perform its function as an electrical insulator. The same applies to the other side of the partition that is facing the chamber: there would also only be a relatively narrow gap in this case between the partition and the conductor track to which the temperature sensor unit is applied. In this case, the two gaps formed by the partition can be so narrow that, from a manufacturing point of view, it is not possible to ensure that the potting compound will form so as to be thick enough, and therefore electrically insulating enough, in these gaps.

In addition, the remaining through-gap between the lower edge of the partition and the carrier plate can be so narrow that potting compound cannot flow into the through-gap, meaning that air would remain there. Air has considerably worse insulation properties than the potting compound, however. It should therefore be expected that the combination of very narrow gaps and air inclusion is not insulating enough. For this reason, it is also advantageous to reduce the partition thickness in the contact region toward the carrier plate. The remaining corner regions consequently become substantially wider and the potting compound can reliably develop on both sides of the partition to a sufficient thickness for an insulating effect.

In order to avoid the risk of an air inclusion between the lower edge of the partition and the carrier plate that could lead to a failure in the insulation, it is necessary to ensure that potting compound can flow in between the lower edge of the partition and the carrier plate, which requires making the through-gap h equally large enough. The reduced thickness d of the partition is therefore related to the required gap height h of the through-gap: the greater the reduced thickness d of the partition is chosen to be, the greater the gap height h of the through-gap also has to be chosen to be.

According to a preferred embodiment of the invention, the housing walls have at least one side wall and/or longitudinal wall that has a smaller wall thickness in comparison to the rest of the housing walls, with the result that it can act as a predetermined breaking point in the event of increased pressure in the interior of the housing. In this way, the stability of the chamber of the temperature sensor is increased in comparison to the stability of the rest of the power module. In the event of a short circuit in the region of the semiconductors, in the first instance, the gases arising in an explosive manner emanate to all sides. This pressure wave then propagates in the direction of the lowest mechanical resistance, with the result that the at least one thinned-down side wall and/or the at least one thinned-down longitudinal wall first yield(s) to the pressure and break(s) before the partitions forming the chamber of the temperature sensor unit are damaged. Completely or even partially maintaining the mechanical integrity of the chamber of the temperature sensor unit means that a voltage transfer from the main circuit side to the control unit can be avoided.

According to a preferred embodiment of the invention, the power module has two or more semiconductor elements, between which the temperature sensor unit is disposed. This has the advantage that the accuracy of the temperature measurement is relatively high due to the short distances between the semiconductors and the temperature sensor.

According to a preferred embodiment of the invention, the temperature sensor unit has electrical lines for supplying the temperature sensor with power. An advantage in this case is that components that are at the potential of the operating plane are disposed together in the chamber and are isolated from the potential of the main circuit.

According to a preferred embodiment of the invention, the temperature sensor unit has a conductor track that rests on the carrier plate and forms an electrical feed line to the temperature sensor. An advantage in this case is that components that are at the potential of the operating plane are disposed together in the chamber and are isolated from the potential of the main circuit.

According to a preferred embodiment of the invention, the partitions have at least one opening that forms a connection channel between the chamber and the rest of the interior of the housing, through which an electrically insulating potting compound can flow into the chamber. This has the advantage that the electrically insulating potting compound can protect the temperature sensor from environmental influences and encase it for electrical insulation.

According to a preferred embodiment of the invention, at least one of the partitions has a two-layer or multi-layer construction. This has the advantage that the mechanical stability of a multi-layered wall can be increased compared to a single-layered wall of the same thickness.

Other features which are considered as characteristic for the invention are set forth in the appended claims.

Although the invention is illustrated and described herein as embodied in a power module, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings. The above-described properties, features and advantages of this invention and the manner in which they are achieved become more clearly and distinctly comprehensible by way of the following description of the drawings, which are not true to scale.

BRIEF DESCRIPTION OF THE FIGURES

FIGS. 12 to 14 are sectional views of a further refinement of a power module having a separate chamber component.

DETAILED DESCRIPTION OF THE INVENTION

Figure 1:
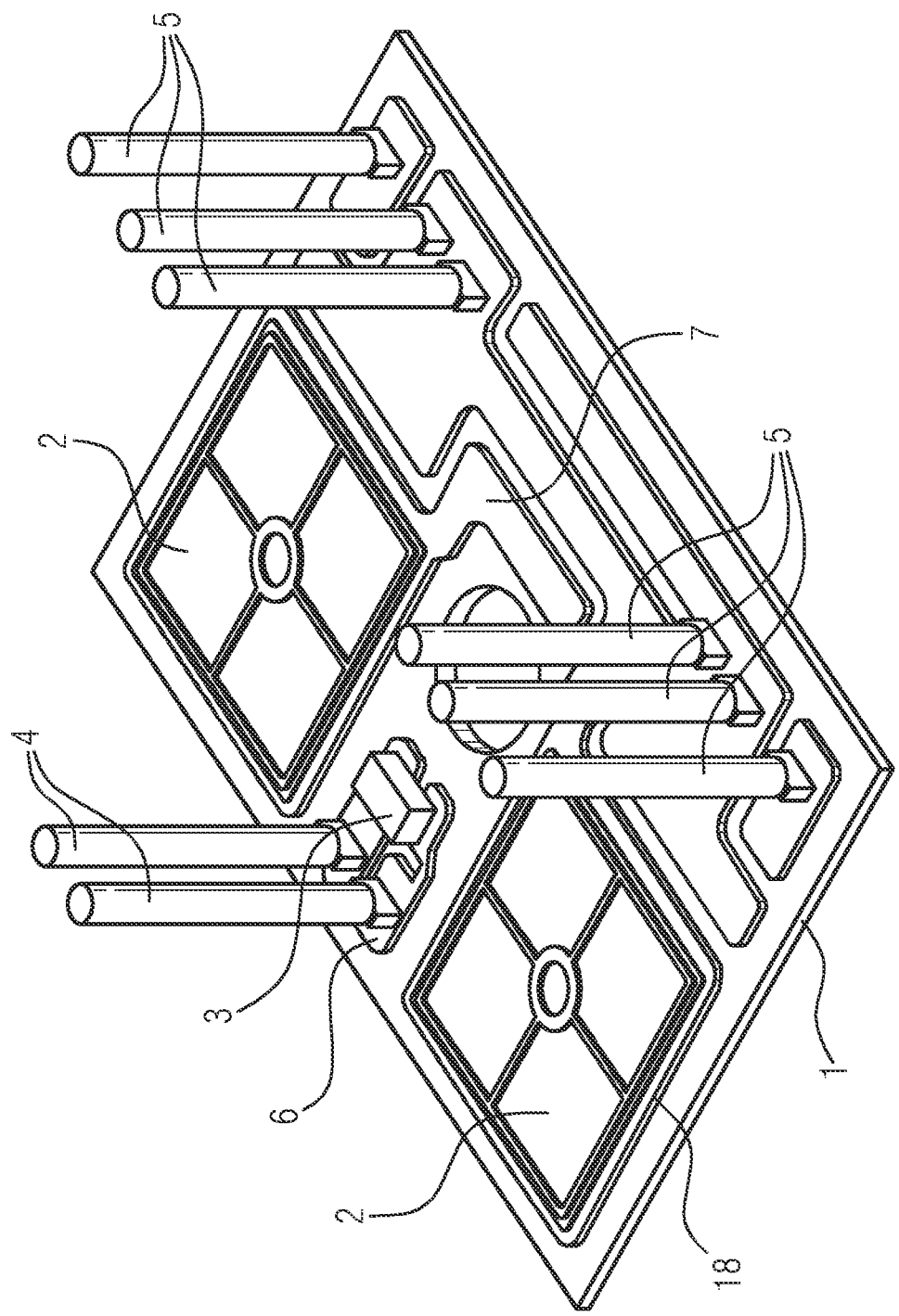
FIG. 1 is a diagrammatic, perspective view of a carrier plate of a power module.

Referring now to the figures of the drawings in detail and first, particularly, to FIG. 1 thereof, there is seen a carrier plate 1 of a power module on which two semiconductor elements 2 and a temperature sensor 3 are disposed. Also shown are electrical lines 4, 5 that are in the form of column-shaped connection pins and make contact with conductor tracks 6, 7 of the carrier plate 1 that rest on the carrier plate 1. The conductor tracks 6, 7 that are preferably in the form of copper tracks form the electrical feed lines to the two semiconductor elements 2 and the temperature sensor 3. In this case, the semiconductor elements 2 are disposed on conductor surfaces 18 that rest on the carrier plate 1 and are in the form of copper surfaces.

There are two regions on the carrier plate 1 that belong to different voltage levels. On one hand, the two semiconductor elements 2, the conductor tracks 7 that make contact with those semiconductor elements and the electrical lines 5 (connection pins) in contact with those conductor tracks 7 are part of the voltage level of the main circuit. On the other hand, the temperature sensor 3, with the conductor tracks 6 thereof and the associated electrical lines 4 (connection pins), belong to the voltage level of a control unit in which there is a substantially lower voltage than in the main circuit.

The temperature sensor 3 is located between the two semiconductor elements 2 and is only a short distance therefrom. Placing the temperature sensor 3 between the two semiconductor elements 2 means that the space requirement on the carrier plate 1 does not increase, with the result that the power module can be kept very compact. Furthermore, the short distance between the temperature sensor and the two semiconductor elements is advantageous for the accuracy of the temperature measurement.

The spatial proximity between the two semiconductor elements 2 and the temperature sensor 3 necessitates measures, in the event of a short circuit in the main circuit that can lead to explosive vaporization processes and therefore destruction in the region of the semiconductor elements 2. These measures are provided to protect the temperature sensor 3 from the effects of the short circuit at least to the extent that a brief or else continuous voltage transfer from the voltage level of the main circuit to the voltage level of the temperature sensor 3 and therefore of the control unit is prevented.

Figure 6:
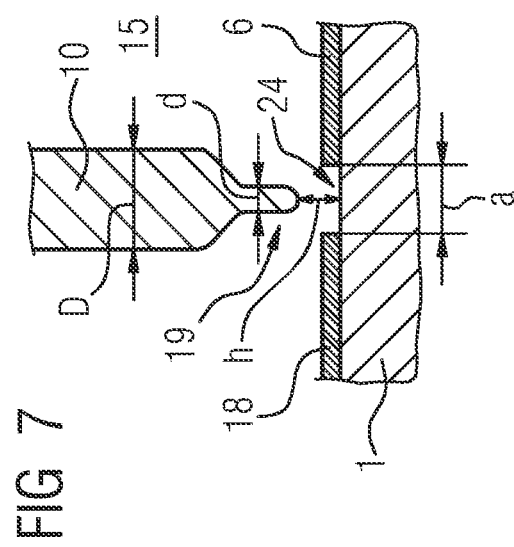
FIGS. 6 to 9 are fragmentary, sectional views of a partition according to four different refinements.
Figure 7:
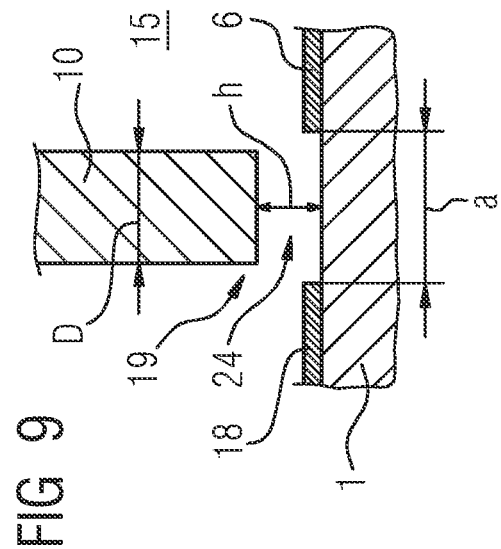
Figure 8:
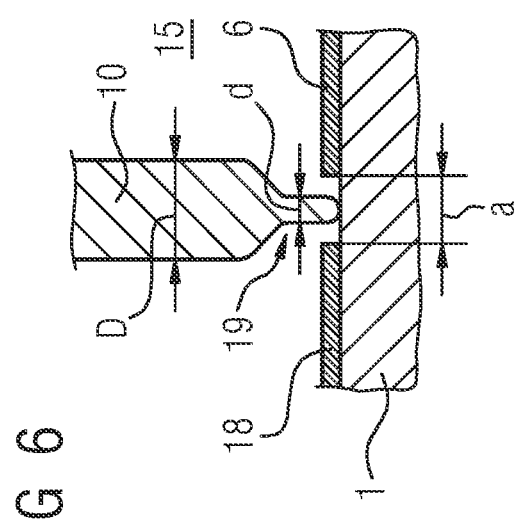
Figure 9:
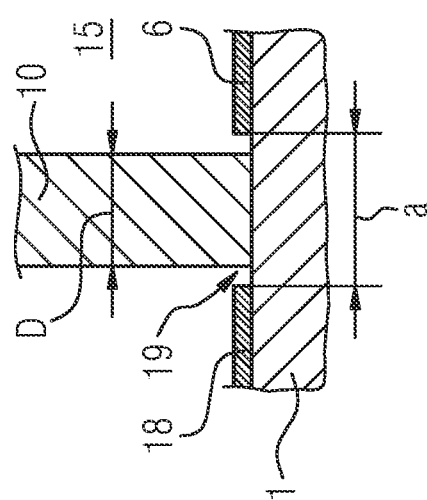

FIGS. 2 to 5 illustrate how, to achieve this object, the temperature sensor 3 is spatially separated, according to the invention, from the region of the main circuit by using structural measures. For this purpose, walls are attached to a housing cover 8 of a housing 100 of a power module 9 that act as partitions 10 in the interior of the housing 100, formed by the carrier plate 1 forming the housing base. The housing cover 8 and housing walls 11 extend between the carrier plate 1 and the housing cover 8. These partitions 10 create a chamber 15 around the temperature sensor unit 3, 4, 6, formed of the temperature sensor 3, the conductor tracks 6 that make contact with the temperature sensor and the associated electrical lines 4. The chamber largely closes off the temperature sensor unit, which is connected to the voltage level of the control unit, from the rest of that region of the power module 9 that belongs to the voltage level of the main circuit. The partitions 10 are of such a depth that, with the housing cover 8 placed onto the housing walls 11, they reach as far as the carrier plate 1, as shown in FIGS. 6 and 8, or leave at least only a through-gap 24 of the gap height h to the carrier plate 1, as shown in FIGS. 7 and 9. In this case, the gap height h is chosen in such a way that the potting compound can still flow through the through-gap 24 but at the same time the shielding effect and mechanical stability of the partition 10 are not substantially weakened. Typical gap heights can be in a range of from 0.1 to 3 mm. These values are only exemplary and should not be understood as being restrictive in any way. The through-gap 24 can also have any other gap height h that proves suitable for the respective application.

The housing cover 8 has filling openings 12 for filling in a potting compound and a through-hole 22 that extends vertically through a column 23 disposed centrally in the power module 9. The through-hole 22 serves the purpose of enabling a screw to pass through so that the power module 9 can be pressed onto a heat sink.

As shown in FIGS. 6 to 9, the partitions 10 have a wall thickness D that is thick enough for their function as explosion protection and are attached to the available housing walls 11 and the housing cover 8 in such a way that a stable chamber 15 is produced around the temperature sensor unit 3, 4, 6. Typical wall thicknesses can be in a range of from 0.5 to 5 mm. These values are only exemplary and should not be understood as being restrictive in any way. The partitions 10 can also have any other wall thickness D that proves suitable for the respective application. The stability of the chamber 15 is great enough that it is not destroyed by the effects of a short circuit or is only destroyed to the extent that a voltage transfer from the voltage level of the main circuit to that of the temperature sensor unit 3, 4, 6 can be prevented.

Figure 2:
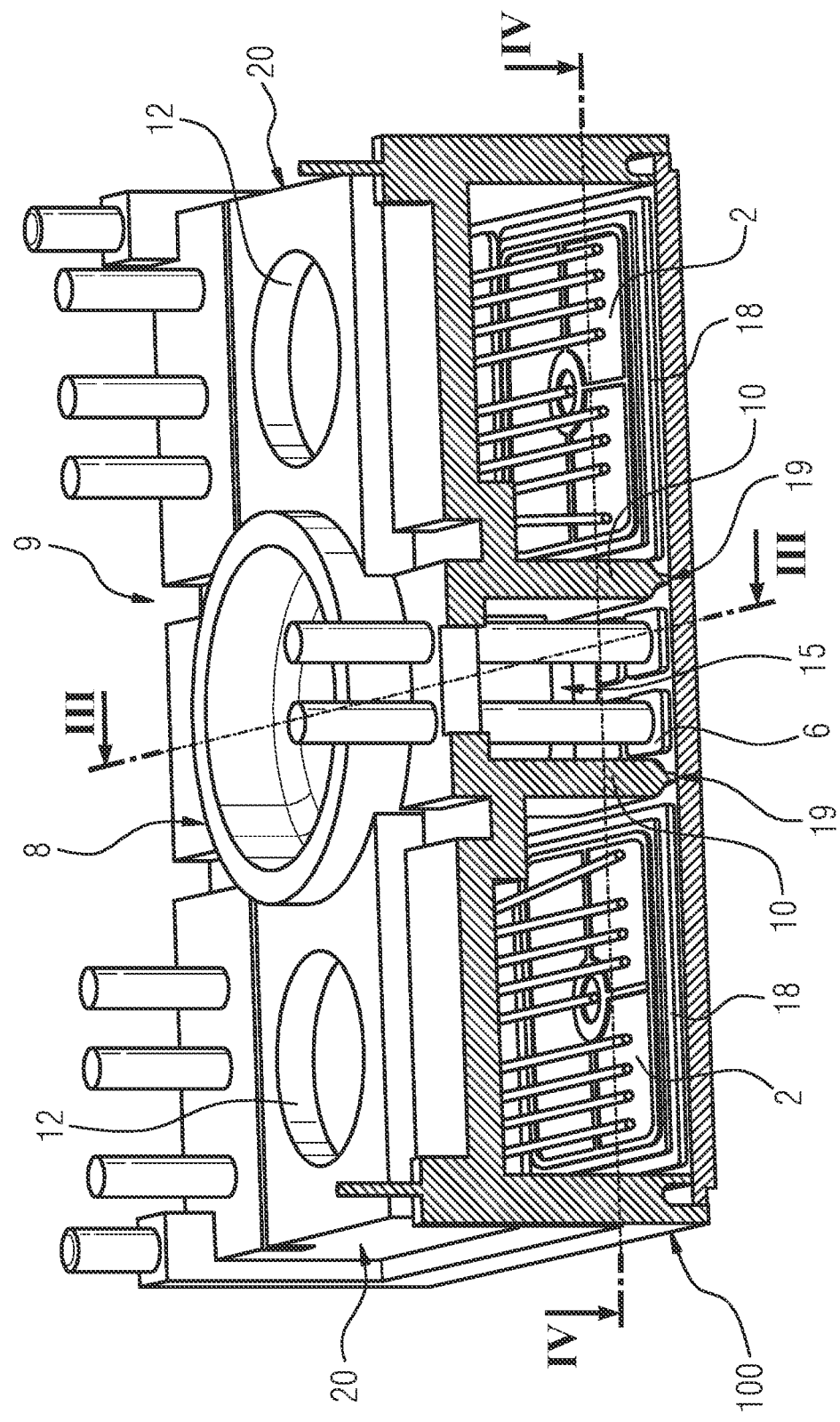
FIG. 2 is a longitudinal-sectional view of the power module of FIG. 1, which is taken along the line II-II of FIG. 3, in the direction of the arrows.

The electrical components of a power module are encased by an electrically insulating potting compound for protection from environmental influences and for electrical insulation. The potting compound is filled in through one of the two filling openings 12 in the housing cover 8 that are shown in FIG. 2 until a predetermined fill level 16 has been reached that ensures that all of the electrically conductive parts in the interior of the power module 9 are encased, thereby achieving electrical insulation and protection from environmental influences.

Figure 3:
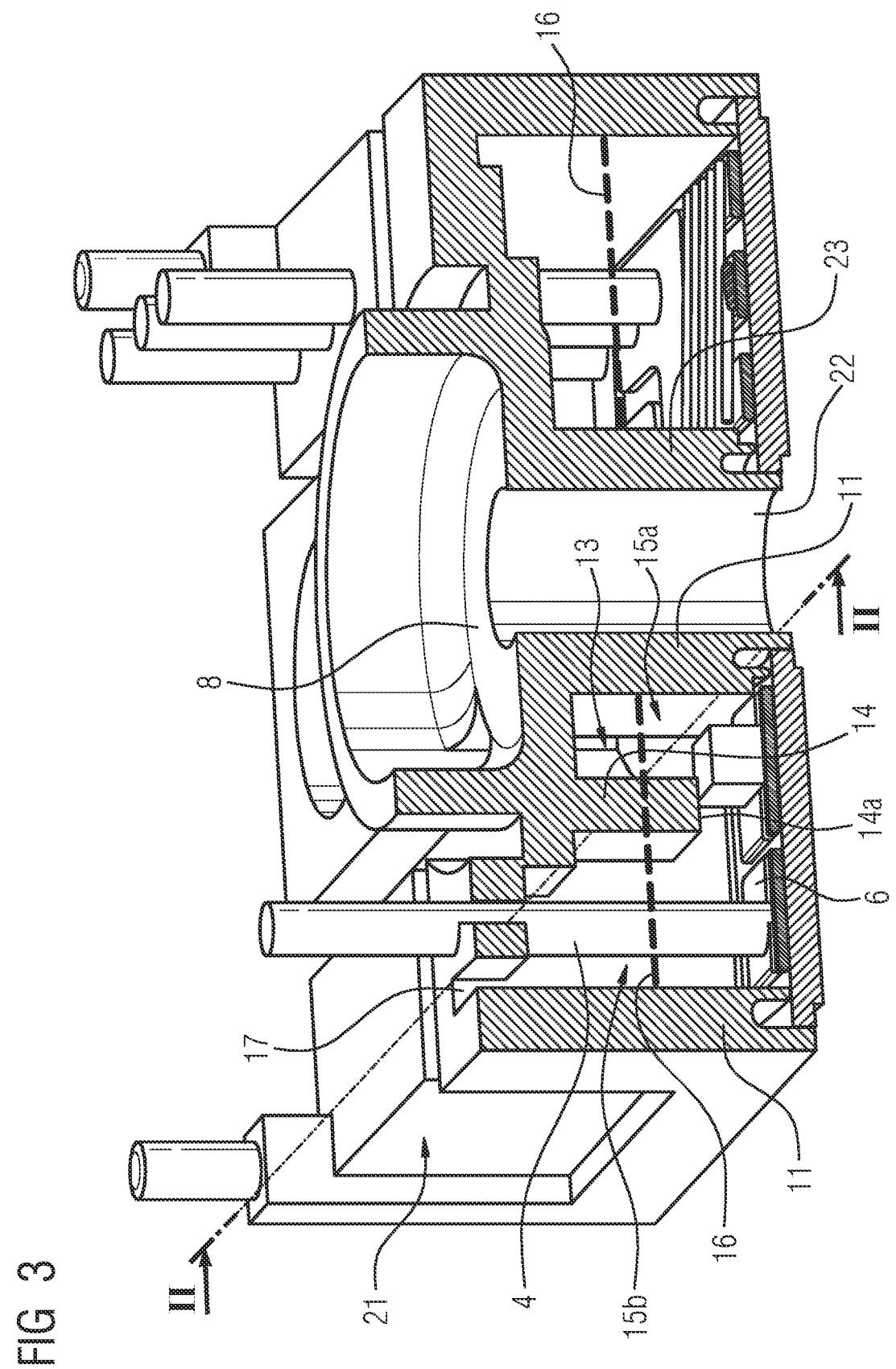
FIG. 3 is a cross-sectional view of the power module of FIG. 1, which is taken along the line III-III of FIG. 2, in the direction of the arrows.
Figure 5:
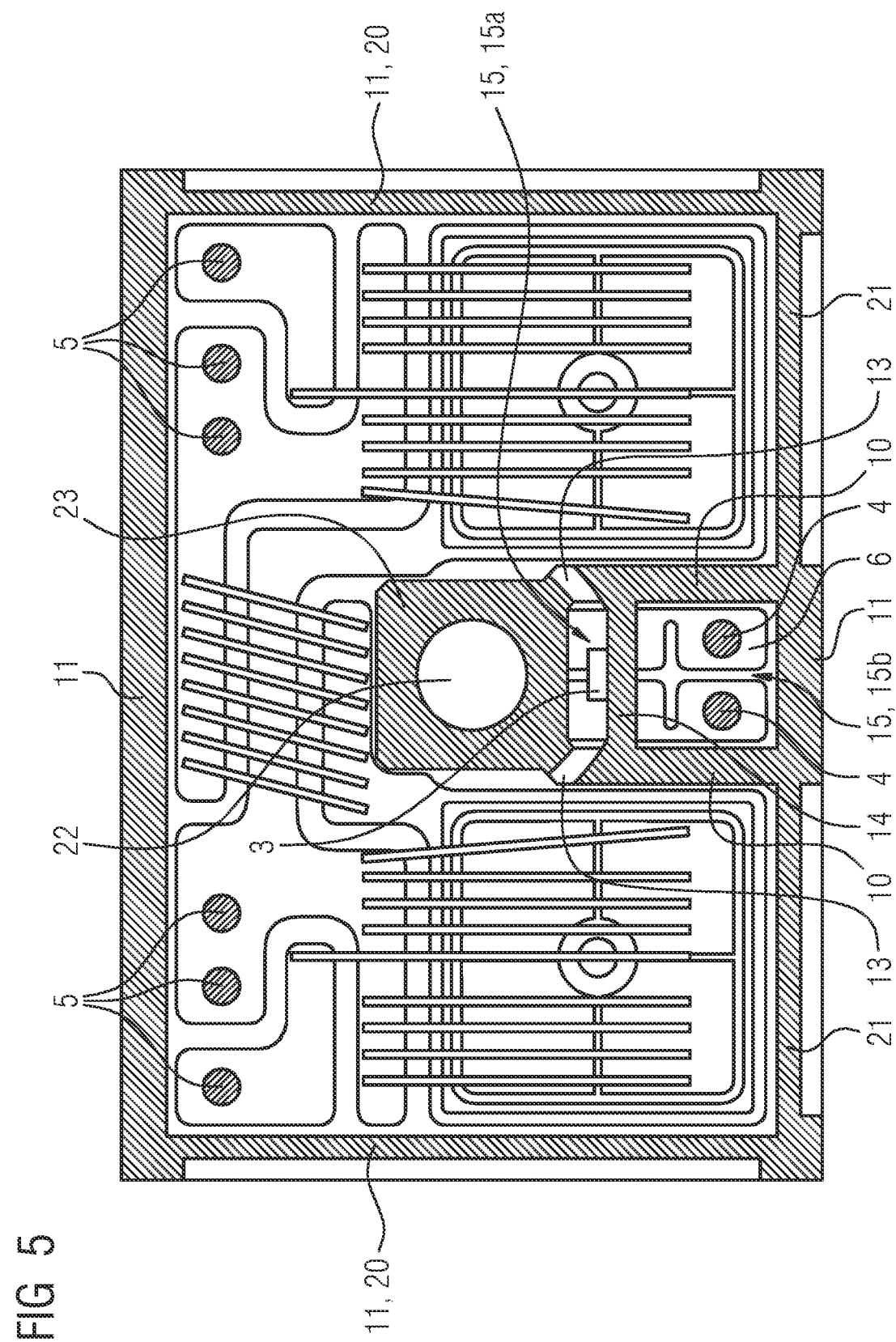
FIG. 5 is a top-plan view of the horizontal section IV-IV of the power module of FIG. 1.

Connection channels 13 that are shown in FIG. 3 and FIG. 5 are inserted into the partitions 10 so that the potting compound can also enter the chamber of the temperature sensor unit. The potting compound is not filled up to the lower edge of the housing cover 8 for cost reasons and for technical reasons. If the chamber is completely filled, in the event of temperature changes, due to thermal expansion of the potting compound, pressure forces can act on the housing cover 8 and the carrier plate 1 that cause the housing cover 8 to lift off from the carrier plate 1 and can therefore impair the electrical insulation properties of the power module 9.

So as to prevent, in the event of a short circuit, electrically conductive gases that can enter through the connection channels 13 of the chamber 15 from reaching the electrical lines 4 of the temperature sensor 3 and therefore causing a voltage transfer from the main current side to the voltage level of the control unit, the electrical lines 4 are isolated by using an additional wall 14 that divides the chamber 15 into a main chamber 15a in which the temperature sensor 3 is disposed, and a half-open lower chamber 15b in which the electrical lines 4 are disposed. The additional wall 14 is, as shown in FIG. 3, only of such a depth that the remaining opening between a lower edge 14a of the additional wall 14 and the carrier plate 1 is large enough for the potting compound to be able to also flow into the lower chamber 15b and therefore cover all regions of the carrier plate 1 within the chamber 15. In this way, in the lower chamber 15b as well the conductor tracks 6 are completely encased and the electrical lines 4 are partially encased and therefore electrically insulated. So that the potting compound can also rise up to the intended fill level 16, which is depicted in dashed lines in FIG. 3, in the lower chamber 15b, a ventilation opening 17 is inserted in the housing cover 8.

Figure 4:
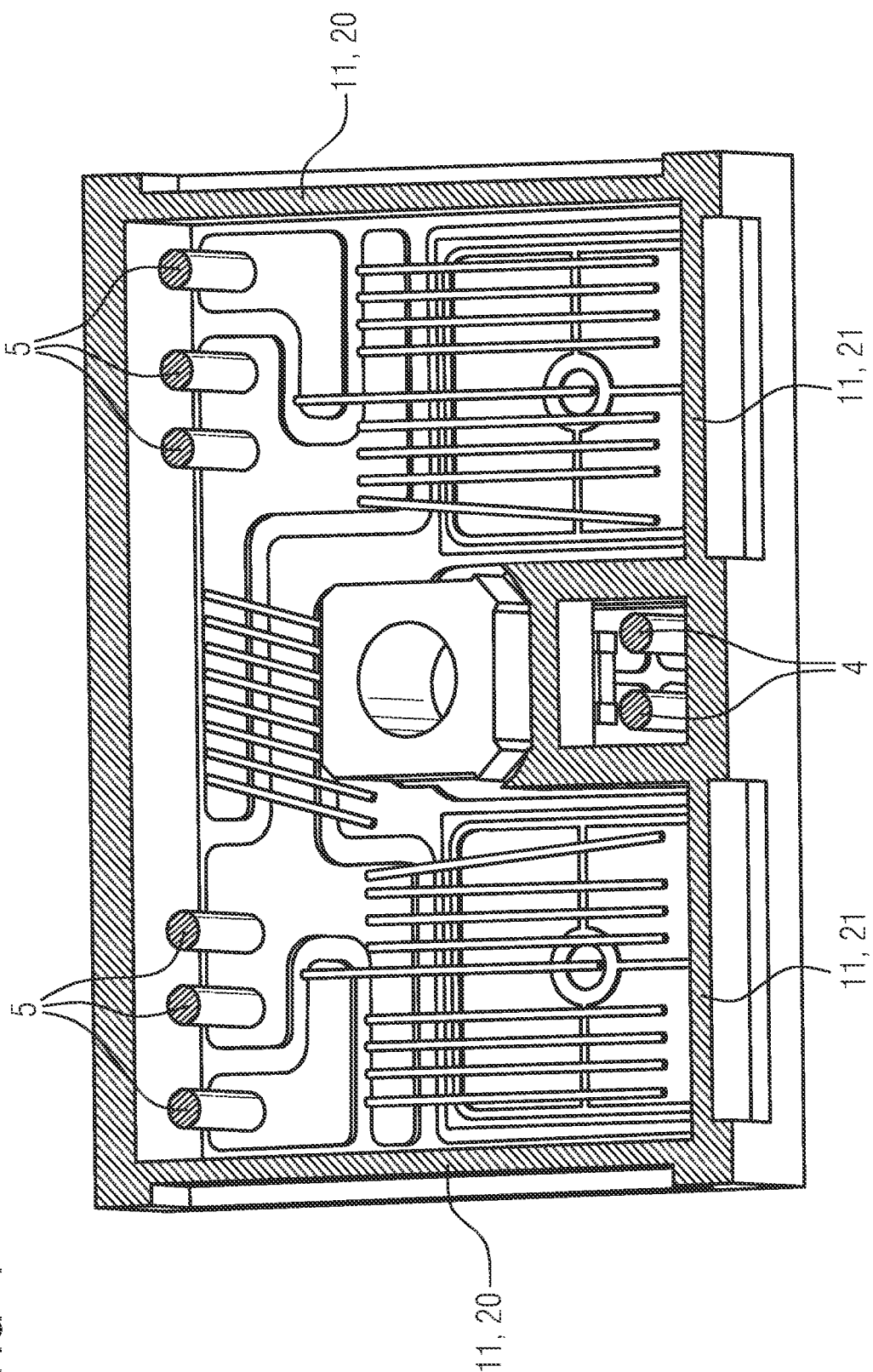
FIG. 4 is a perspective, horizontal-sectional view of the power module of FIG. 1, which is taken along the line IV-IV of FIG. 2, in the direction of the arrows.

As a further measure for avoiding a voltage transfer from the voltage level of the main circuit to the voltage level of the control unit, for example, side walls 20 of the housing walls 11 and longitudinal walls 21 of the housing walls 11 can be constructed so as to be thinned down in certain regions, as shown in FIGS. 4 and 5. In this way, the stability of the chamber 15 of the temperature sensor unit 3, 4, 6 is increased in comparison to the stability of the rest of the power module 9. In the event of a short circuit in the region of the semiconductor elements 2, in the first instance, the gases arising in an explosive manner emanate to all sides. This pressure wave then propagates in the direction of the lowest mechanical resistance, with the result that the thinned-down side walls 20 and the thinned-down longitudinal wall 21 first yield to the pressure and break before the partitions 10 of the temperature sensor unit 3, 4, 6 are damaged. Completely or even partially maintaining the mechanical integrity of the chamber 15 of the temperature sensor unit 3, 4, 6 means that a voltage transfer from the main circuit to the control unit can be avoided.

FIGS. 6 to 9 show sections of a partition according to four different refinements. Due to the spatial compactness of the power module 9, a distance a between conductor surfaces 18, to which the semiconductor elements 2 are applied, and the conductor track 6 of the temperature sensor unit 3, 4, 6 can be relatively short, as can be seen in FIG. 2. The electrical insulation between the conductor surfaces 18 of the semiconductor elements 2 that belong to the voltage level of the main circuit and the conductor track 6 of the temperature sensor unit 3, 4, 6 that belongs to the voltage level of the control unit is achieved by the potting compound that covers the conductor track 6 and the conductor surfaces 18. So that the potting compound can perform its electrical insulation function, the layer thickness of the potting compound has to have a minimum thickness. Typical layer thicknesses of the potting compound can be in a range of from 0.5 to 5 mm. This value is only exemplary and should not be understood as being restrictive in any way. The potting compound can also have any other layer thickness that proves suitable for the respective application. So that the partitions 10 that extend as far as, or almost as far as, the carrier plate 1 do not reduce the thickness of the potting compound impermissibly in the region of the perpendicular edges of the conductor track 6 and the conductor surface 18, the partitions 10, as shown in FIGS. 6 and 7, can be thinned down to a thickness d at a lower edge 19 thereof so that the potting compound can still develop to a sufficient thickness in the corner regions, delimited by the conductor track 6 or conductor surface 18, of the carrier plate 1 and the partition 10. In this case, FIG. 6 shows an embodiment in which the thinned-down edge 19 bears against the carrier plate 1. In contrast, FIG. 7 shows an embodiment in which, between the thinned-down edge 19 and the carrier plate 1, there is the through-gap 24 which has the gap height h and into which the potting compound can flow.

Typical reduced wall thicknesses d can be in a range of from 0.2 to 3 mm. These values are only exemplary and should not be understood as being restrictive in any way. The partitions 10 can also have any other reduced wall thickness d that proves suitable for the respective application.

If the distance a between the conductor surfaces 18, to which the semiconductor elements 2 are applied, and the conductor track 6 of the temperature sensor unit 3, 4, 6 is large enough, it is not necessary to reduce the wall thickness of the partitions 10 at the lower edge 19 thereof. Instead, the partitions 10 can have a uniform thickness D over their entire height, as shown in FIGS. 8 and 9. In this case, FIG. 8 shows an embodiment in which the edge 19 of the partition 10 bears against the carrier plate 1. In contrast, FIG. 9 shows an embodiment in which, between the thinned-down edge 19 and the carrier plate 1, there is a through-gap 24 which has a gap height h and into which the potting compound can flow.

Figure 10:
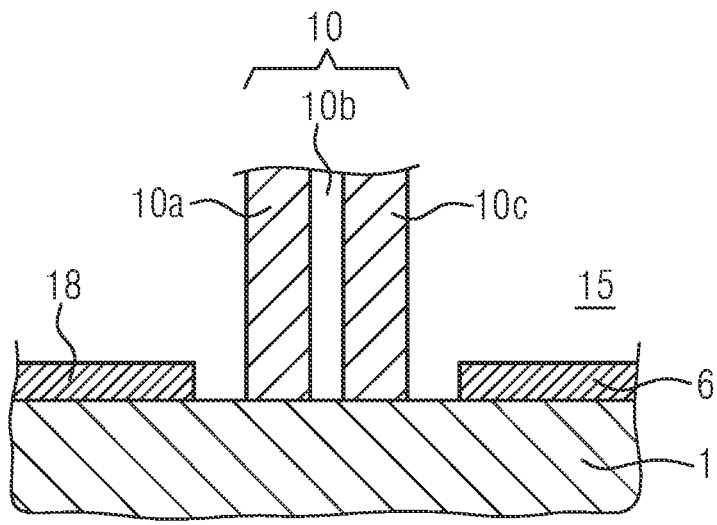
FIGS. 10 and 11 are fragmentary, sectional views of two embodiments of multi-shell partitions.
Figure 11:
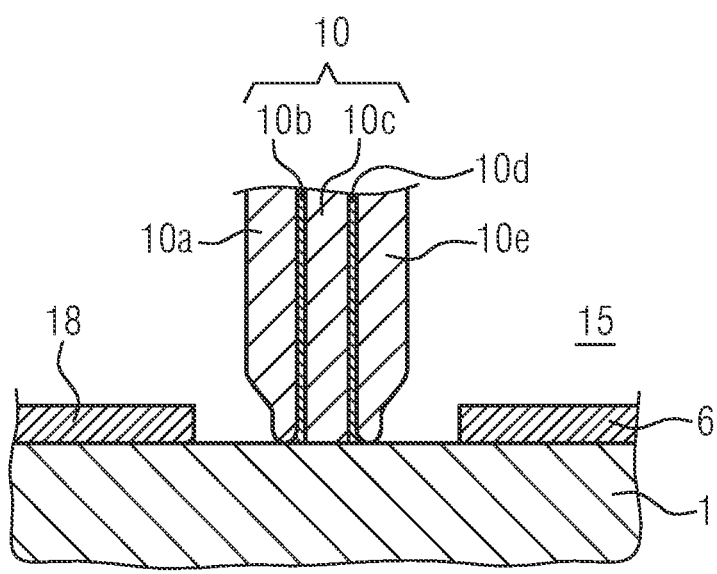

FIGS. 10 and 11 illustrate two embodiments of multi-shell partitions.

FIG. 10 shows a three-shell construction of a partition 10, formed of a first outer shell 10a that is disposed on that side of the partition 10 that is averted from the chamber 15, a second outer shell 10c that is disposed on that side of the partition 10 that is facing the chamber 15, and an intermediate shell 10b that is in the form of a layer of air.

FIG. 11 shows a five-shell construction of a partition 10, having a first outer shell 10a that is disposed on that side of the partition 10 that is averted from the chamber 15, a second outer shell 10e that is disposed on that side of the partition 10 that is facing the chamber 15, and a middle shell 10c that is disposed between the two outer shells 10a and 10e. A respective connection layer 10b or 10d, which for example can be in the form of an adhesive layer, is disposed between the outer shells 10a, 10e and the middle shell 10c.

FIGS. 12 to 14 show a further exemplary embodiment in which a separate mechanical component 30 that is in the form of a chamber 15 is used. This chamber-like component 30 is placed onto the temperature sensor unit 3, 4, 6, as seen in FIGS. 12 and 13, before the housing cover 8 is fitted, as seen in FIG. 14. The features described above, such as filling openings 12 for the potting compound, additional partition 14 for a lower chamber 15b for the electrical lines 4, in the form of connection pins, of the temperature sensor unit 3, 4 and 6, and the tapering of the partitions 10 at the edge thereof toward the carrier plate 1 can also be used in this separate chamber component. Already existing power modules can also be retrofitted with the separate chamber component 30, since no changes have to be made to the housing cover 8.

The invention claimed is:

1. A power module, comprising:
a housing including an interior, a carrier plate, housing walls and a housing cover;
semiconductor elements disposed on said carrier plate in said interior of said housing;
a temperature sensor unit having a temperature sensor disposed on said carrier plate in said interior of said housing; and
partitions disposed in said interior of said housing, said partitions separating said temperature sensor unit from said semiconductor elements and enclosing said temperature sensor unit in a chamber, and said partitions including a lower edge facing said carrier plate and having a reduced wall thickness.

2. The power module according to claim 1, wherein said partitions are connected to said housing cover and form a component with said housing cover.

3. The power module according to claim 1, wherein said partitions are a separate component disposed on said carrier plate in said interior of said housing.

4. The power module according to claim 1, wherein said lower edge reaches said carrier plate or forms a narrow through-gap between said partitions and said carrier plate.

5. The power module according to claim 1, wherein said semiconductor elements include two or more semiconductor elements, said temperature sensor unit being disposed between said two or more semiconductor elements.

6. The power module according to claim 1, wherein said temperature sensor unit has electrical lines for supplying said temperature sensor with power.

7. The power module according to claim 1, wherein said temperature sensor unit has a conductor track resting on said carrier plate and forming an electrical feed line to said temperature sensor.

8. The power module according to claim 1, wherein at least one of said partitions has a two-layer or multi-layer construction.

9. A power module, comprising:
a housing including an interior, a carrier plate, housing walls and a housing cover;
semiconductor elements disposed on said carrier plate in said interior of said housing;
a temperature sensor unit having a temperature sensor disposed on said carrier plate in said interior of said housing;
partitions disposed in said interior of said housing, said partitions separating said temperature sensor unit from said semiconductor elements and enclosing said temperature sensor unit in a chamber;
said housing walls having at least one of at least one side wall or at least one longitudinal wall and a remainder of said housing walls; and
said at least one of at least one side wall or at least one longitudinal wall having a smaller wall thickness than said remainder of said housing walls, permitting said at least one of at least one side wall or at least one longitudinal wall to act as a predetermined breaking point in an event of increased pressure in said interior of said housing.

10. A power module, comprising:
a housing including an interior, a carrier plate, housing walls and a housing cover;
semiconductor elements disposed on said carrier plate in said interior of said housing;
a temperature sensor unit having a temperature sensor disposed on said carrier plate in said interior of said housing;
partitions disposed in said interior of said housing, said partitions separating said temperature sensor unit from said semiconductor elements and enclosing said temperature sensor unit in a chamber;
said interior of said housing including said chamber and a remainder of said interior of said housing;
said partitions having at least one through-opening forming a connection channel between said chamber and said remainder of said interior of said housing; and
said at least one through-opening being configured to permit an electrically insulating potting compound to flow through said at least one through-opening into said chamber.

* * * * *